United States Patent
Shi et al.

(10) Patent No.: US 6,462,586 B1
(45) Date of Patent: Oct. 8, 2002

(54) SELECTABILITY OF MAXIMUM MAGNITUDES FOR K-WINNER TAKE ALL CIRCUIT

(75) Inventors: Bingxue Shi; Guoxing Li, both of Beijing (CN)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/849,458

(22) Filed: May 4, 2001

(51) Int. Cl.[7] ................................. H03L 5/22
(52) U.S. Cl. ........................... 327/63; 327/103
(58) Field of Search ..................... 327/58–62, 69–71, 327/103, 405, 404, 407, 408, 63

(56) References Cited

U.S. PATENT DOCUMENTS

| | | | | |
|---|---|---|---|---|
| 5,195,170 A | * | 3/1993 | Eberhardt | 326/35 |
| 6,020,953 A | * | 2/2000 | Barrows | 356/28 |
| 6,198,311 B1 | * | 3/2001 | Shi et al. | 327/58 |

* cited by examiner

Primary Examiner—Timothy P. Callahan
Assistant Examiner—Cassandra Cox
(74) Attorney, Agent, or Firm—J.C. Patents

(57) ABSTRACT

A k-WTA circuit for selecting inputs which have a maximum-magnitude and outputting the results. k-WTA is very useful in pattern classification such as k-nearest neighbor classifier, Hamming neural classifier and some cascaded classification systems, since one classifier can not achieve very high performance, however, if a small set of candidates can be provided, for example k(k<<N), then a simple classifier with small complementary feature sets can be cascaded to realize multi-stage classification. A k-WTA network is necessary to implement this function. The circuit as disclosed in the invention provides a design for a circuit in which the number of inputs with maximum magnitudes at any one time can be chosen. The circuit can have a plurality of inputs each of which has a corresponding output. In one embodiment of the invention external inputs can select the number of maximum-magnitudes inputs to be selected through the use of a current positive feedback loop. Depending on the number of maximum-magnitude inputs selected the circuit will output voltage levels on the outputs that correspond to inputs whose current levels have higher magnitudes when compared to other inputs. The circuit has the further advantages of reconfigurability, self-adaptivity, low complexity, high accuracy, expandability, and a large dynamic range.

6 Claims, 4 Drawing Sheets

SELECTABILITY OF MAXIMUM MAGNITUDES FOR K-WINNER TAKE ALL CIRCUIT

BACKGROUND OF INVENTION

FIELD OF THE INVENTION

The present invention relates to a winner-take-all (WTA) analog circuit, and more particularly, to a WTA circuit wherein the number of prominent elements selected can be chosen.

Artificial neural networks and fuzzy logic are very effective in processing complex scientific, and engineering problems such as pattern classification since both of them are non-parametric, and need no mathematical model. Their massive parallelism, learning ability, adaptivity, and fault tolerance make them more attractive in the field of pattern information processing. Although software simulations based on theory of artificial neural networks, and fuzzy logic paradigms can be performed in conventional Von Neumann machines, the simulations usually take too much time for practical applications. Recently many significant advances in electronic implementation of neural networks, and fuzzy logic have been achieved. Winner-take-all networks for selecting the most prominent one from N elements are central processing components in most models of neural networks such as Hamming neural network, ART (Adaptive Resonance Theory) model, SOFM (Self-organized Feature Mapping) model, and fuzzy processors. It can be regarded as 1-WTA if only one prominent element is selected at one time, we call it k-WTA networks if it can select k maximum from N elements.

The WTA networks are mainly implemented with analog circuits since WTA functions are nonlinear, and can make full use of the nonlinearity of analog circuits. There are two modes to implement WTA with analog circuits, current mode and voltage mode. Two kinds of complexity will exist according to wire length, and the number of transistors used in the WTA circuits, one is linearly proportional to the number of input elements, and the other is quadratic.

k-WTA is very useful in pattern classification such as k-nearest neighbor classifier, Hamming neural classifier, and some cascaded classification systems, since one classifier can not achieve very high performance, however, if a small set of candidates can be provided, for example k(k<<N), then a simple classifier with small complementary feature sets can be cascaded to realize multi-stage classification. A k-WTA network is necessary to implement this function. Several WTA circuits have been reported in the literatures. Most of them however can only realize the 1-WTA function having a complexity of $O(N^2)$. This high complexity can make them difficult to implement when they process a large number of input elements in the network. Further many of these WTA circuits need an applied bias current, so that the range of inputs is limited.

SUMMARY OF THE INVENTION

It is therefore the object of the present invention to provide a k-WTA analog circuit wherein k maximum from N elements can be selected. The WTA analog circuit disclosed herein provides for a plurality of inputs and outputs. Each input, its corresponding output, and associated circuitry serve to form stages within the circuit. Therefore the circuit has the advantage of expandability, as the scale of the k-WTA circuit can be easily expanded by adding further stages. The inputs can also be weighted. The present invention has a further advantage of being self-adaptive, as it needs no externally applied bias current, voltage, or clock signals. This allows for a large dynamic range of input currents.

It is a further objective of the present invention to provide a k-WTA circuit that is easily reconfigurable as 1-WTA, 2-WTA, or 3-WTA. In the invention as disclosed the circuit can be reconfigured as seen in one embodiment through the use of external select-inputs which can be logical voltage levels. In the preferred embodiment if the select-inputs are both low logic levels then the circuit is configured as 1-WTA. This means that only one input with a maximum-value is selected with its corresponding output. If either of the select-inputs is high and the other is low then the circuit is configured as 2-WTA and 2 current inputs with maximum values are selected with their corresponding outputs. If both select-inputs are high then the circuit is configured as 3-WTA and 3 current inputs with maximum values are selected with their corresponding outputs.

DETAILED DESCRIPTION

In the following detailed description of the preferred embodiments, reference is made to the accompanying drawings which form a part hereof and in which is shown by way of illustration specific preferred embodiments in which the invention may be practiced. The preferred embodiments are described in sufficient detail to enable those skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only by the appended claims.

Figure 1:
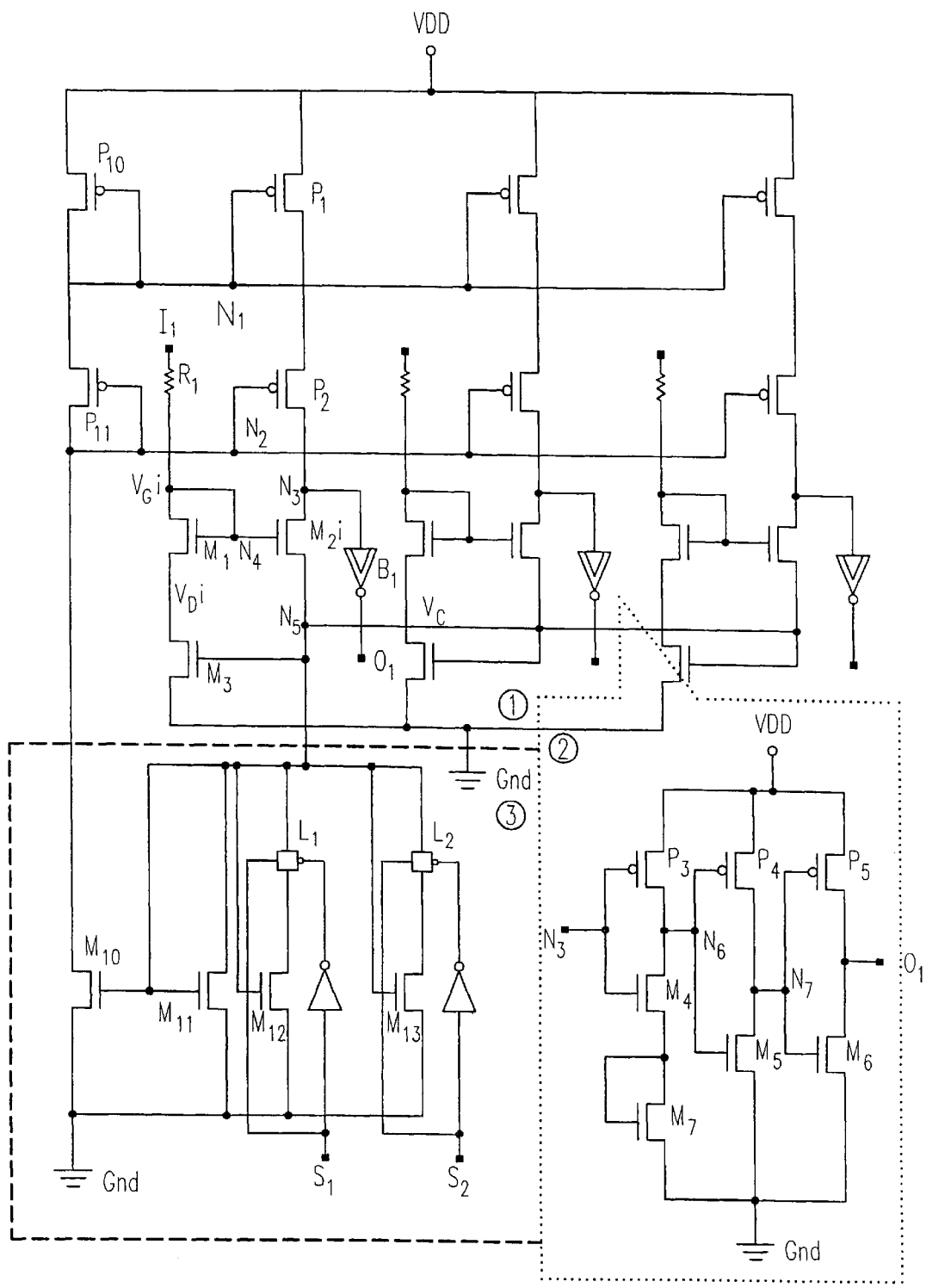
FIG. 1 is a circuit diagram of one preferred embodiment of the invention.

FIG. 1 shows a k-selectable WTA analog circuit which is the preferred embodiment of the invention. Compared to other designs the circuit as described has a low complexity wherein the needed transistors are linearly proportional to the current input terminals. The circuit is composed of 3 inputs ($I_1$ to $I_3$), and three outputs ($O_1$–$O_3$). The input signals are current which can have a large dynamic range, while the outputs are voltage levels. Each input and it corresponding output with associated circuitry form a stage. The circuit shown in FIG. 1 is composed of three stages, however one skilled in the art will recognize that any number of stages with their corresponding inputs, and outputs can be cascaded. The use of cascaded stages allows the circuit to be easily expanded. Each stage is composed of 2 PMOS transistors, and 3 NMOS transistors. Reference will be made to stage 1 of the circuit as all of the following stages are identical. The source of PMOS P1 is connected to $V_{DD}$. The gate of P1 is connected to Node N1. The drain of P1 is connected to the source of P2. The gate of P2 is connected to Node N2. The drain of P2 is connected to node N3.

The input $I_1$ is connected to resistor R1. Resistor R1 is optional and can be used to change the magnitude of the input currents by changing the value of the resistor. This method can be used to assign different weights to a plurality of inputs. Input I1 and resistor R1 are connected to node N4. Node N4 also connects to the drain of MI and the gates of M1 and M2. The source of MI is connected to the drain of M3. The drain of M2 is connected to node N3. Node N3 is connected to output circuit B1 and further to output O1. The gate of M3 and the source of M2 connect to Node NS.

For simplicity of the description, output circuit B1 has been shown outside the main circuit in section 2. The output circuit is composed of 3 PMOS transistors, and 4 NMOS transistors. The input of the circuit is connected to node N3, and the output is O1. A signal from node N3 is connected la the gates of transistors P3 and M4. The drains of P3 and M4 are connected to node N6. The source of M4 is connected to the gate and drain of M7. Node N6 is connected to the gates of P4 and M5. The drains of P4 and M5 are connected to node N7. Node N7 connects to the gates of P5 and M6. The drains of P5 and M6 are connected to output O1. The sources of M7, M5, and M6 are all connected to ground. The sources of P3, P4, and P5 are all connected to $V_{DD}$.

Connected to the cascaded stages as described above are 2 PMOS transistors, and the circuit shown in section 3. The PMOS transistor P10 has a source connect to $V_{DD}$ and its gate and drain connected to node N1. PMOS transistor P11 has a source connected to node N1, and a gate and drain connected to node N2. Referring now to section 3, a circuit is shown that selects the number of k elements in the WTA circuit through the use of signals S1 and S2. The circuit is composed of 4 NMOS transistors (M1O–M13). The drain of M11 is connected to node N2. The gates of M10, M11, M12, and M13 are connected to node N5. The drain of M11 is connected to node N5. The drains of M12 and M13 are connected to the fourth side of latches L1 and L2 respectively. Signal S1 is connected to the third side of the latch L1, and to the first side of Latch L1 through an inverter. The second side of latch L1 is connected to node N5. Signal S2 is connected to the third side of the latch L2, and to the first side of Latch L2 through an inverter. The second side of latch L2 is connected to node N5.

Figure 2A:
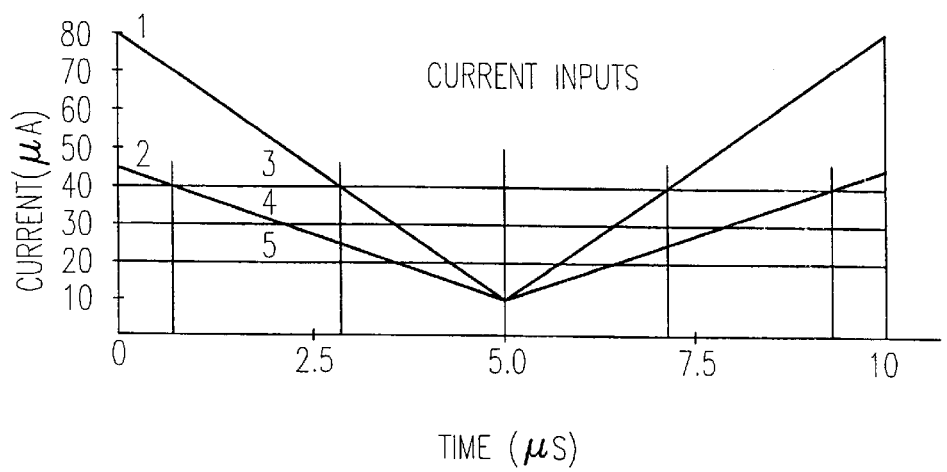
FIG. 2A is a timing diagram showing WTA circuit inputs and the corresponding output signals for a circuit in a 1-WTA configuration.
Figure 2A:
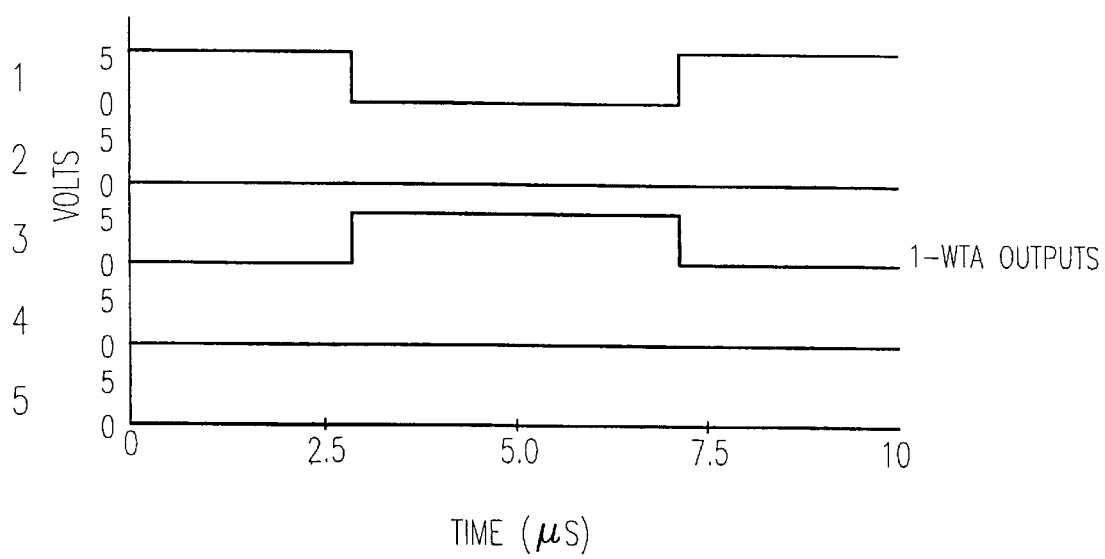
Figure 2B:
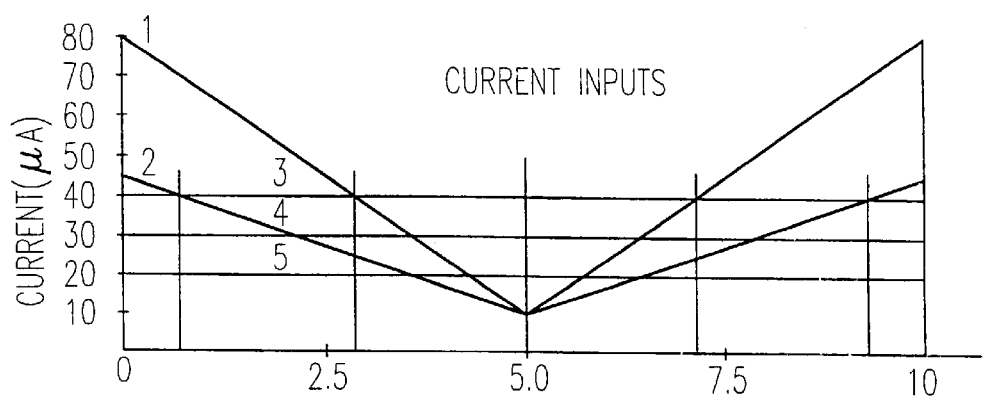
FIG. 2B is a timing diagram showing WTA circuit inputs and the corresponding output signals for a circuit in a 2-WTA configuration.
Figure 2B:
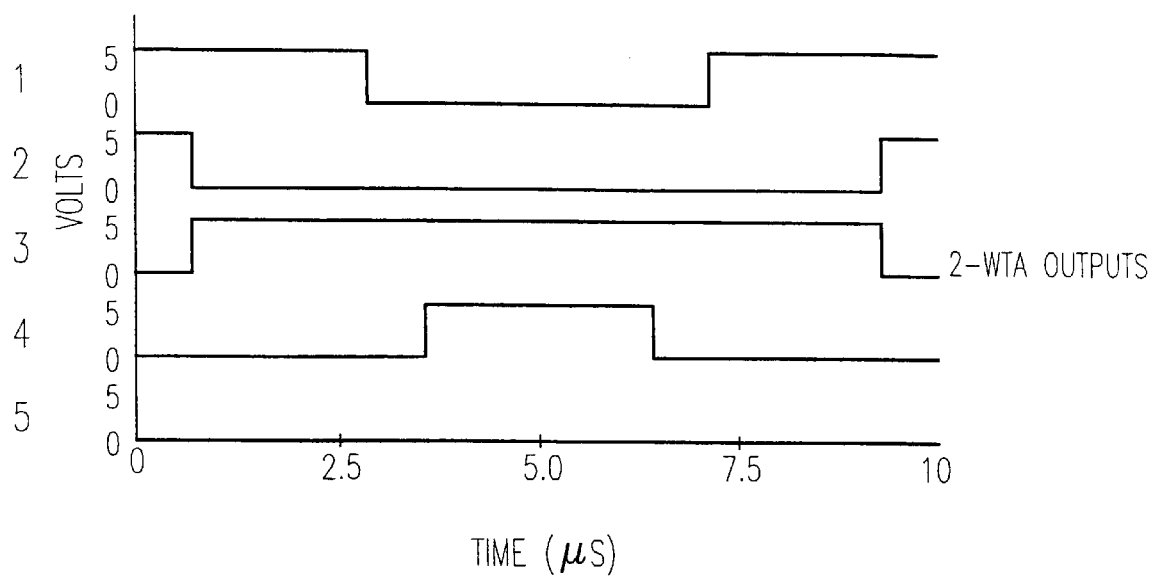
Figure 2C:
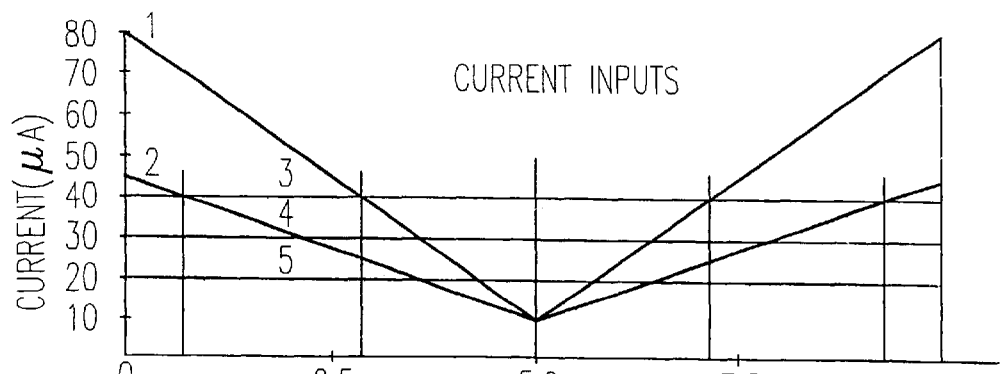
FIG. 2C is a timing diagram showing WTA circuit inputs and the corresponding output signals for a circuit in a 3-WTA configuration.
Figure 2C:
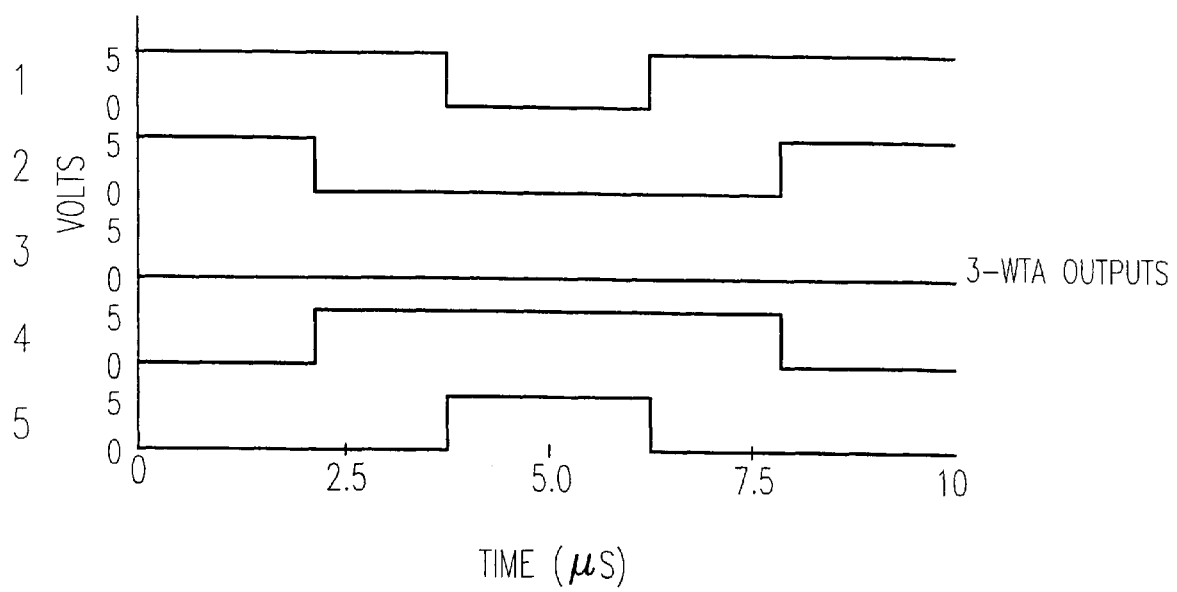

The circuit is able to reconfigure the number of k elements by using the voltage inputs S1 and S2. In the preferred embodiment these inputs would be logical voltage levels corresponding to a high and a low. When S1 and S2 are both presented with a low logic level the circuit is configured as 1-WTA. When either S1 or S2 (S1 or S2) are a high logic level the circuit is configured as 2-WTA. When both S1 and S2 (S1 and S2) are high logic levels then the circuit is configured as 3-WTA. FIGS. 2A, 2B, and 2C an input and the corresponding outputs for a circuit in a 1-WTA, 2-WTA, and 3-WTA circuit configuration respectively. It should be noted that someone skilled in the art will recognize that many methods can be used to select a different k-WTA configurations including using varying number of inputs, different input signals, and different devices that all serve to achieve the same purpose.

All transistors in the k-WTA work in strong inversion so high speed, and wide dynamic range can be obtained. The precision of this network is proportional to gmN $r_{dSM}$ with the same input currents, and proportional to $1/I^{1/2}$ with the same transistor dimensions, while the speed is proportional to $I^{1/2}$. This k-WTA can also work in weak inversion, in this time, the constant high value of $g_{mN}r_{dsM}$ allows precision in the range of picoamps. So there is some trade-off among precision, speed, and die areas of the chip. Some optimization can be made according to actual applications.

The circuit achieves self-adaptivity, and reconfigurability through the use of a current positive feedback loop. For example if the circuit is configured in a 1-WTA configuration, and there is a plurality of input currents to be fed into the WTA, if Ii>Ij(j≠0, j=0, 1, ... , N–1) then we have:

$$Ii=K_M(V_C-V_T)^2(1+\lambda V_Di)^2 \quad (1)$$

$$Ij=K_M(V_C-V_T)^2(1+\lambda V_Dj)^2 \quad (2)$$

where K is a process parameter, $V_C$ is common voltage as shown in FIG. 1, and $V_Di$ is the drain voltage of transistors Mi. If equation (1) subtracts equation (2) we can obtain $V_Di>V_Dj$. As for transistors M2 we also approximately have:

$$Ii=K_N(V_Gi-V_Di-V_T)^2 \quad (3)$$

$$Ij=K_N(V_Gj-V_Dj-V_T)^2 \quad (4)$$

from these two equations, the result of $V_Gi>V_Gj$ can be derived and so the transistor M1 is the first to turn on since the value of $V_Gi-V_C$ is the largest. The strong current positive feedback loop will make only transistor M2i turn on, and the M2 transistors in the other stages turn off. In this time, the drain voltage of M2i transistor goes low to a middle level and the other drain voltages will go high. An asymmetrical inverter will raise the middle level to a high logic level, and make the others go low. A buffer is used to further improve the output level. The circuit has a further advantage of avoiding dc matching errors due to asymmetrical biasing.

If S1 or S2 go high the circuit is reconfigured as 2-WTA. Supposing Ii>Ij>Ik(k≠i, j, k=0, 1, ... , N–1), as shown above transistor M2i will turn on, but only when two M2 transistors are turned on, the positive feedback loop makes the circuit converge to a stable point, since at this time, the actual ratio of the NMOS current mirror in the configuring part is 1:2. The next possible M2 transistor to turn on must be M2j. So the circuit implements a 2-WTA circuit configuration. The circuit can further perform any value of k in a k-WTA analog circuit by performing operations in a similar manner.

The invention has been described using exemplary preferred embodiments. However, it is to be understood that the scope of the invention is not limited to the disclosed embodiments. On the contrary, it is intended to cover various modifications, and similar arrangements. The scope of the claims, therefore, should be accorded the broadest interpretation so as to encompass all such modifications and similar arrangements.

What is claimed is:

1. An analog k-WTA circuit, comprising of:
   a means to select maximum magnitude current inputs;
   a means to select numbers of the maximum magnitude current inputs selected at any one time;
   a means to output logic voltage levels corresponding to the selected numbers of maximum magnitude current inputs; and
   a weight-adjusting means coupled to the current inputs.

2. An analogy k-WTA, comprising:
   a maximum-value determination circuit, capable of selecting the inputs with greatest magnitudes, and outputting appropriate signals corresponding outputs; and
   a circuit which utilizes a current positive feedback loop for selecting a number of inputs with greater magnitudes used at any one time, connected to said maximum-value determination circuit.

3. The analog k-WTA circuit of claim 2 wherein the number of inputs with greater magnitudes selected at any one time, can be determined through the use of external inputs.

4. The analog k-WTA circuit of claim 2, further composing inputs that can be weight-adjusted.

5. An analog k-WTA circuit, comprising:
   a maximum-value determination circuit, capable of selecting a number of inputs with greatest magnitudes and outputting appropriate signals on corresponding outputs; and
   a circuit for selecting a number of inputs with greater magnitudes used at any one time, connected to said maximum-value determination circuit, wherein the number of inputs with greater magnitudes selected at any one time can be determined through an use of external inputs.

6. The analog k-WTA circuit of claim 5, further comprising inputs that can be weight-adjusted.

* * * * *